United States Patent
Tsao et al.

(10) Patent No.: US 10,177,043 B1
(45) Date of Patent: Jan. 8, 2019

(54) METHOD FOR MANUFACTURING MULTI-VOLTAGE DEVICES USING HIGH-K-METAL-GATE (HKMG) TECHNOLOGY

(71) Applicant: Taiwan Semiconductor Manufacturing Co., Ltd., Hsin-Chu (TW)

(72) Inventors: Chun-Han Tsao, New Taipei (TW); Chii-Ming Wu, Taipei (TW); Cheng-Yuan Tsai, Chu-Pei (TW); Yi-Huan Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/793,163

(22) Filed: Oct. 25, 2017

Related U.S. Application Data

(60) Provisional application No. 62/545,207, filed on Aug. 14, 2017.

(51) Int. Cl.
*H01L 21/8238* (2006.01)
*H01L 29/66* (2006.01)
(Continued)

(52) U.S. Cl.
CPC ........... *H01L 21/823857* (2013.01); *H01L 21/823835* (2013.01); *H01L 21/823864* (2013.01);
(Continued)

(58) Field of Classification Search
CPC .............. H01L 27/11573; H01L 29/66545
See application file for complete search history.

(56) References Cited

U.S. PATENT DOCUMENTS

| 2015/0206891 A1* | 7/2015 | Chuang | ............ H01L 27/11573 |
| | | | 257/325 |
| 2016/0013198 A1* | 1/2016 | Liu | ............ H01L 27/11524 |
| | | | 257/322 |
| 2017/0200729 A1* | 7/2017 | Dai | ............ H01L 29/66545 |

OTHER PUBLICATIONS

Lauwers, et al. "CMOS Integration of Dual Work Function Phase Controlled Ni FUSI with Simultaneous Silicidation of NMOS (NiSi) and PMOS (Ni-rich silicide) Gates on HfSiON." IEEE International Electron Devices Meeting, 2005. IEDM Technical Digest, Dec. 5, 2015.

(Continued)

*Primary Examiner* — Dung A. Le
(74) *Attorney, Agent, or Firm* — Eschweiler & Potashnik, LLC

(57) ABSTRACT

A method for manufacturing multi-voltage devices is provided. The method includes forming a pair of logic gate stacks in a logic region of a semiconductor substrate and a pair of device gate stacks in a multi-voltage device region. The pair of logic gate stacks and the pair of device gate stacks include first dummy gate material. The pair of device gate stacks also includes a work function tuning layer. The method further includes depositing second dummy gate material over the pair of logic gate stacks. The first dummy gate material and the second dummy gate material from over a first logic gate stack of the pair of logic gate stacks are replaced with an n-type material. The first dummy gate material and the second dummy gate material from over a second logic gate stack of the pair of logic gate stacks are replaced with a p-type material.

20 Claims, 14 Drawing Sheets

(51) Int. Cl.
*H01L 29/49* (2006.01)
*H01L 27/092* (2006.01)

(52) U.S. Cl.
CPC ...... *H01L 27/0922* (2013.01); *H01L 29/4975* (2013.01); *H01L 29/66545* (2013.01)

(56) References Cited

OTHER PUBLICATIONS

Tsuchiya, et al. "Practical Work Function Tuning Based on Physical and Chemical Nature of Interfacial Impurity in Ni-FUSI/SiON and HfSiON Systems." IEDM '06. International Electron Devices Meeting, Dec. 11, 2006.

\* cited by examiner

US 10,177,043 B1

METHOD FOR MANUFACTURING MULTI-VOLTAGE DEVICES USING HIGH-K-METAL-GATE (HKMG) TECHNOLOGY

REFERENCE TO RELATED APPLICATION

This Application claims priority to U.S. Provisional Application No. 62/545,207 filed on Aug. 14, 2017, the contents of which are hereby incorporated by reference in their entirety.

BACKGROUND

The semiconductor integrated circuit (IC) industry has experienced exponential growth over the last few decades. In the course of IC evolution, high voltage technology has been widely used in power management, regulators, battery protectors, DC motors, automotive circuits, panel display drivers, etc. On the other hand, low voltage technology is typically used for logic cores, microprocessors, and microcontrollers. Some modern IC designs integrate both high voltage and low voltage devices on a single chip.

In both high voltage and low-voltage technologies, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the typically polysilicon gate electrode with a metal gate electrode to improve device performance with the decreased feature sizes. Semiconductor devices of the replacement gate technology are integrated on the same chip with a logic core, which supports the logic core to accomplish an intended function and limits or eliminates the need for inter-chip communication. However, there are challenges to embed low voltage devices and high voltage devices on the same chip, especially on 28 nm node and beyond processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
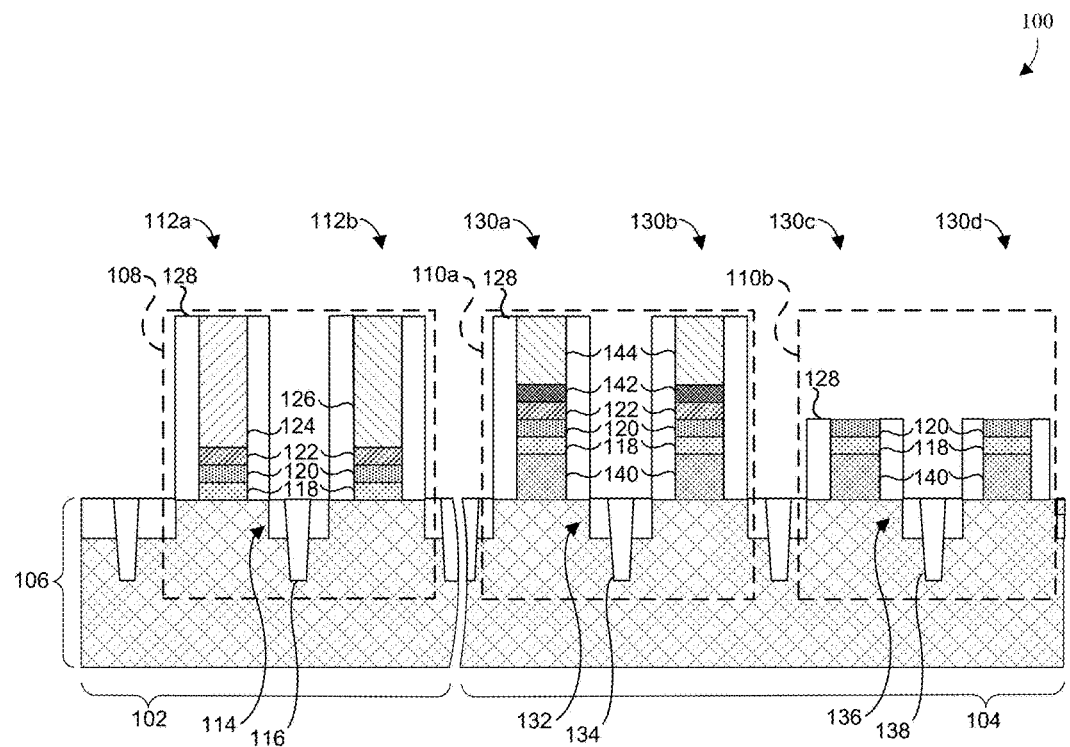
FIG. 1 illustrates a cross-sectional view of some embodiments of an integrated circuit (IC) using high-κ-metal-gate (HKMG) technology and comprising a multi-voltage device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an etch, a dielectric layer, or a substrate) may be referred to as a "first" element in some embodiments, the element may be referred to as a "second" element in other embodiments.

High-k metal gate (HKMG) technology has become one of the front-runners for the next generation of complementary metal oxide semiconductor (CMOS) devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power consumption. HKMG technology can be used for memory devices, display devices, sensor devices, among other applications where a high voltage region is needed and incorporated in the integrated circuits to provide higher power and have higher breakdown voltage than conventional metal oxide semiconductor (MOS) devices.

The threshold voltages of HKMG transistors are controlled by the metal work function of the metal gate electrode. Unlike polysilicon gates that have easily tunable work functions, tuning a metal work function is more complicated because the metal work function is a property of the metal material and cannot be changed easily. However, many circuits utilize multiple voltages over the circuit, with different transistors operating at different voltages and having different voltage thresholds. Thus, for these circuits, a tunable metal work function is desirable. High-k gate dielectrics combined with metal gate electrodes having different work functions have been used to facilitate multi-voltage tuning. However, in traditional approaches, integration of these gate materials and different work function metals using HKMG manufacturing methods has proven to be difficult and time intensive. For example, the silicidation process in traditional multi-voltage approaches has been unable to meet sheet resistance ($R_s$) specifications for the next generation technologies and has also been unable to provide workable work function tuning that is in line with desired process specifications.

In view of the foregoing, various embodiments of the present application are directed towards a method for manufacturing multi-voltage devices using HKMG technology. In some embodiments, a gate stack of the multi-voltage devices is formed on a semiconductor substrate. The gate stack of the multi-voltage devices includes dielectric layers, a barrier layer, a work function tuning layer, and a silicide layer. The work function tuning layer allows the metal work function of the silicide layer to be adjusted resulting in a multi-voltage devices. Furthermore, the logic device and the multi-voltage device have gates that are fully silicided (FUSI). Because the impurity solubility of silicide is low, dopants aggregate at an interface of the fully silicided gate. Impurities contribute to charge dipoles to affect the work function. Accordingly, dopants can be used to modulate the work function.

With reference to FIG. 1, a cross-sectional view 100 of some embodiments of an IC comprising a logic region 102 and a multi-voltage device region 104 on a semiconductor substrate 106. The logic region 102 includes a logic device 108, which is made up a pair of transistors, and the multi-voltage device region 104 includes a first device 110a and a second device 110b. The logic device 108 may be, for example, metal-oxide-semiconductor field-effect transistor (MOSFET), some other type of insulated gate field-effect transistor (IGFET), or some other type of semiconductor device. The devices 110a/110b may be, for example, a memory cell.

The logic device 108 comprises a first logic gate stack 112a corresponding to a first transistor and a second logic gate stack 112b corresponding to a second transistor. The first logic gate stack 112a and the second logic gate stack 112b are separated by logic source/drain regions 114 and an isolation structure 116. The logic source/drain regions 114 are embedded in the semiconductor substrate 106 from the top surface of the semiconductor substrate 106 into the semiconductor substrate 106. The first logic gate stack 112a and the second logic gate stack 112b include a dielectric layer 118, a high κ dielectric layer 120, and a barrier layer 122 that collectively electrically insulate the first logic gate stack 112a and the second logic gate stack 112b from a channel formed in the semiconductor substrate 106, while allowing introduction of an electrical field into the channels of the transistors. In some embodiments, the dielectric layer 118, the high κ dielectric layer 120, and the barrier layer 122 of the first logic gate stack 112a has the composition and dimensions of those of the second logic gate stack 112b.

The first logic gate stack 112a is doped in opposition to the second logic gate stack 112b. For example, the first logic gate stack 112a has a first logic gate material 124 that may be an n-type work function metal suitable for an nMOSFET. In some embodiments, the first logic gate material 124 may have an n-type of approximately 4.1 eV (+/−about 0.3 eV). Accordingly, the second logic gate stack 112b of a second logic gate material 126 may be a p-type work function metal suitable for a pMOSFET. In some embodiments, the second logic gate material 126 may have a work function of a p-type doped material. The second logic gate material 126 may have a p-type work function of approximately 5.2 eV (+/−about 0.3 eV).

In some embodiments, sidewall spacers 128 are positioned along sidewalls of the first logic gate stack 112a and the second logic gate stack 112b. For example, a pair of sidewall spacers 128 may be on opposite sides of the first logic gate stack 112a. As another example, a pair of sidewall spacers 128 may be on opposite sides of the second logic gate stack 112b. The sidewall spacers 128 may, for example, be oxide, nitride, or some other dielectric. Further, for ease of illustration, only some of the sidewall spacers 128 are labeled.

The multi-voltage device region 104 includes a first device gate 130a and a second device gate 130b separated by logic source/drain regions 132 and an isolation structure 134, and a third device gate 130c and a fourth device gate 130d separated by logic source/drain regions 136 and an isolation structure 138. The device gates 130a, 130b, 130c, and 130d include a gate oxide layer 140, as well as the dielectric layer 118, the high κ dielectric layer 120, and the barrier layer 122. The dielectric layer 118, the high κ dielectric layer 120, and the barrier layer 122 over the device gates 130a, 130b, 130c, and 130d are similar as those described with respect to the first logic gate stack 112a and the second logic gate stack 112b.

Overlying the barrier layer 122 of the first device gate 130a and the second device gate 130b is a work function tuning layer 142 and a silicide layer 144. The work function tuning layer 142 is a tunable metal work function material. In some embodiments, the work function of the work function tuning layer 142 may be approximately 4.5 eV (+/−about 0.3 eV). The silicide layer 144 facilitates tuning the work function tuning layer 142. The silicide layer 144 formed by the first device gate 130a and the second device gate 130b are fully silicided, which means majority volume of gate is fully silicided material. Fully silicided device gates tend to have lower sheet resistances ($R_S$) than other approaches. The lower surface of the silicide layer 144 is in direct contact with the upper surface of the work function tuning layer 142. The fully silicided device gates 130a/130b are tuned by the work function tuning layer 142.

The work function tuning layer 142 may not be present on the first logic gate stack 112a or the second logic gate stack 112b of the logic device 108. Accordingly, not forming the work function tuning layer 142 for the first logic gate stack 112a or the second logic gate stack 112b simplifies formation and integration.

Unlike device gate stacks 130a and 130b, the gate material of the device gate stacks 130c and 130d are removed, resulting in dummy transistor structures. The removal of gate material may accommodate other structures. The device 110a may be formed by HKMG or FUSI technology and has low power consumption and high switching speed. The work function tuning layer 142 allows the metal work function of the silicide layer to be adjusted resulting in a devices. Further, where the device 110a uses HKMG technology, the devices 110a/110b may advantageously be scaled in different process nodes, such as, for example, 10, 16, 20, and 28 nanometer process nodes.

Figure 2:
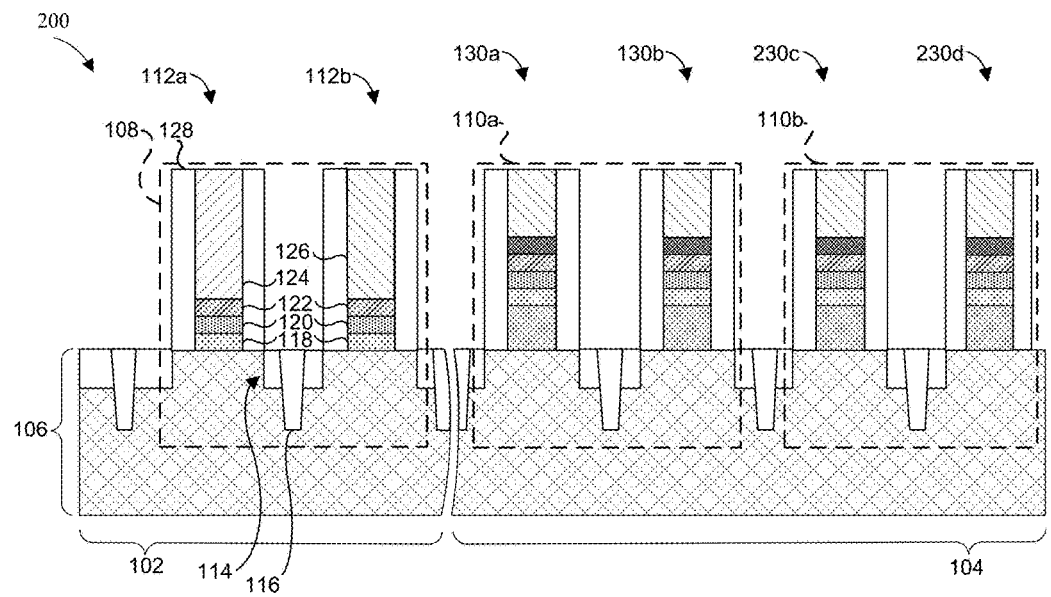
FIG. 2 illustrates a cross-sectional view of some more detailed embodiments of the IC using HKMG technology and comprising the multi-voltage device of FIG. 1.

With reference to FIG. 2, a cross-sectional view 200 of some more detailed embodiments of the IC of FIG. 1 is provided. As described above with respect to FIG. 1, the device gate stacks 130c and 130d are planarized. Here, the device 110b also includes fully silicided gates 230c and 230d such that the device 110b is operational. Accordingly, the IC may have a plurality of devices that are configured to operate at a particularly voltage different from that of a logic device 108.

Figure 3:
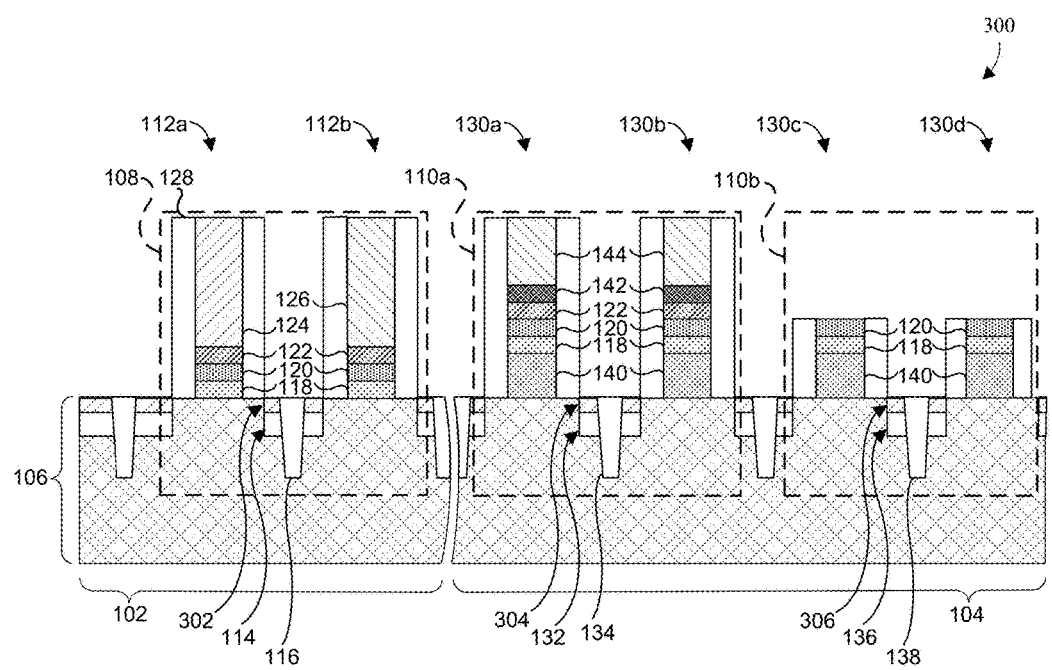
FIG. 3 illustrates a cross-sectional view of some more detailed embodiments of the IC using HKMG technology and comprising the multi-voltage device of FIG. 2.

With reference to FIG. 3, a cross-sectional view 300 of some more detailed embodiments of the IC of FIG. 1 is provided. As described with respect to FIG. 1, the logic region 102 includes the logic device 108, and the multi-voltage device region 104 includes a first device 110a and a second device 110*b*. The logic device 108, the first device 110*a*, and a second device 110*b* operate in the manner described above. Here, a first silicided region 302 is positioned in the semiconductor substrate 106 between the first logic gate stack 112*a* and the second logic gate stack 112*b*. The first silicided region 302 is arranged above the source/drain regions 114.

A second silicided region 304 is positioned in the semiconductor substrate 106 between the first device gate stack 130*a* and the second device gate stack 130*b*. Vertically, the second silicided region 304 is arranged above the source/drain regions 132 and below a top surface of the semiconductor substrate 106.

A third silicided region 306 is positioned in the semiconductor substrate 106 between the third device gate stack 130*c* and the fourth device gate stack 130*d*. Vertically, the third silicided region 306 is arranged above the source drain regions 136 and below a top surface of the semiconductor substrate 106.

With reference to FIGS. 4-25, a series of cross-sectional views 400-2500 illustrate some embodiments of a method for manufacturing an IC with embedded memory using HKMG technology. The IC may, for example, be the IC of FIG. 1.

Figure 4:
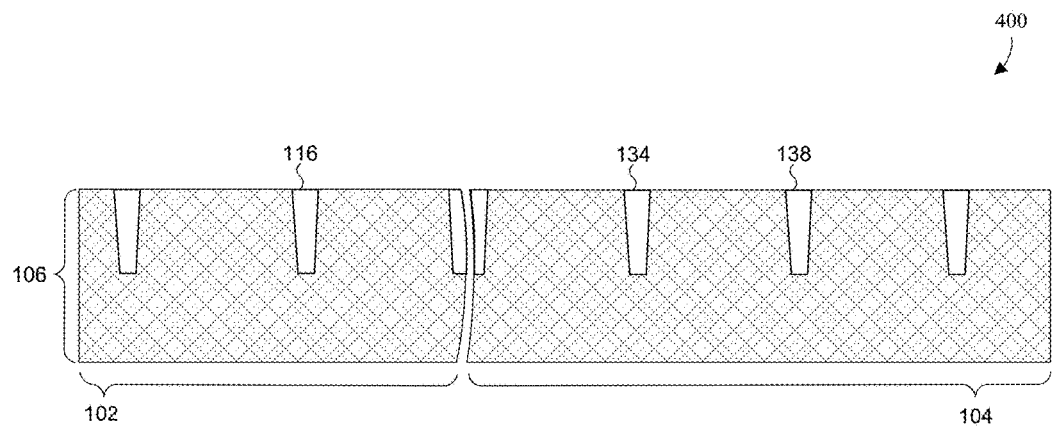
FIGS. 4-25 illustrate a series of cross-sectional views of some embodiments of a method for manufacturing an IC with the multi-voltage device using HKMG technology.

As illustrated by the cross-sectional view 400 of FIG. 4, a logic region 102 and a multi-voltage device region 104 are formed over a semiconductor substrate 106. Isolation structures, such as isolation structures 116, 134, and 138, are formed extending into a top surface of a semiconductor substrate 106 to demarcate the logic region 102 of the semiconductor substrate 106 from the multi-voltage device region 104. The isolation structures 116, 134, and 138 may be, for example, a shallow trench isolation structure, a deep trench isolation structure, or some other type of isolation structure. In some embodiments, a process for forming the isolation structures 116, 134, and 138 comprises forming trenches demarcating the logic region 102 and the multi-voltage device region 104 of the semiconductor substrate 106, and subsequently filling the trenches with a dielectric material. For ease of illustration, only some of the isolation structures 116, 134, and 138 are labeled.

Figure 5:
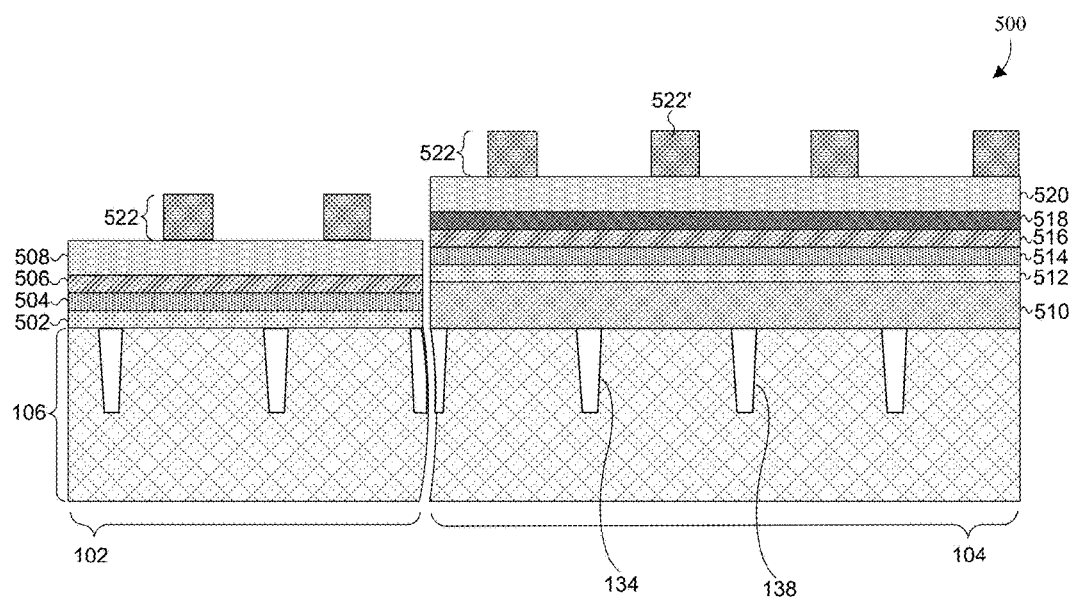

As illustrated by the cross-sectional view 500 of FIG. 5, layers are formed over the logic region 102 and a multi-voltage device region 104 on the semiconductor substrate 106. A first set of layers 502-508 is formed over the logic region 102 and a second set of layers 510-520 is formed over the multi-voltage device region 104. The first set of layers 502-508 includes a dielectric layer 502, a high κ dielectric layer 504, a barrier layer 506, and a first dummy gate layer 508 by sequentially performing a plurality of growth and/or deposition processes. The growth and/or deposition processes may comprise, for example, thermal oxidation, chemical or physical vapor deposition, sputtering, some other growth or deposition process, or a combination of the foregoing.

The dielectric layer 502 is comprised of a dielectric material about 10 to 30 Å thick, for example, the dielectric layer 502 may be 20 Å thick. The high κ dielectric layer 504 is comprised of a high κ dielectric material about 10 to 30 Å thick, for example, the high κ dielectric layer 504 may be 20 Å thick. The barrier layer 506 is comprised of a metallic material about 10 to 30 Å thick, for example, the barrier layer 506 may be 20 Å thick. In some embodiments, the barrier layer 506 may be nitride or another dielectric, for example, a titanium nitride (TiN). The layers 502-506 may be collectively referred to as a dielectric stack.

The first dummy gate layer 508 may be less than or about 300 Å thick. For example, the first dummy gate layer 508 may be about 100 to 300 Å thick. The first dummy gate layer 508 is comprised of a first dummy gate material and may be, for example, polysilicon or some other material capable of being silicided.

The second set of layers 510-520 includes a gate oxide (GOX) layer 510, a dielectric layer 512, a high κ dielectric layer 514, a barrier layer 516, a work function tuning layer 518, and the first dummy gate layer 520 by sequentially performing a plurality of growth and/or deposition processes. The growth and/or deposition processes may comprise, for example, thermal oxidation, chemical or physical vapor deposition, sputtering, some other growth or deposition process, or a combination of the foregoing.

The GOX layer 510 is comprised of a gate oxide. The first set of layers 502-508 may be simultaneously deposited with some of the layers of the second set of layers 512-516 and form a dielectric stack over the GOX layer 510 of the multi-voltage device region 104. Accordingly, corresponding layers such as the dielectric layer 502 and the dielectric layer 512 may be similar, if not the same, in composition and dimension as those of the first set of layer 502-508.

The work function tuning layer 518 is comprised of a metallic material about 0.4 to 10 micrometers (μm) thick, for example. In some embodiments, the work function tuning layer 518 may be platinum (Pt), palladium (Pd), tantalum (Ta), ytterbium (Yb), aluminum (Al), silver (Ag), titanium (Ti), ruthenium (Ru), and molybdenum (Mo), chromium (Cr), tungsten (W), copper (Cu), or similar material. Alternatively, the work function tuning layer 518 may be III-group (e.g., boron (B)) or V-group (e.g., nitrogen (N)) doped material. The first dummy gate layer 520 is about 100 to 300 Å thick, for example, the first dummy gate layer 520 may be 200 Å. The first dummy gate layer 520 may be comprised of the first dummy gate material, and be, for example, polysilicon or some other material containing silicon.

A first mask 522 is selectively deposited over the first set of layers 502-508 and the second set of layers 510-520. The first mask 522 is deposited between the isolation structures 116, 134, and 138. In some embodiments, the first mask is a photoresist layer. For example, the first mask 522' is positioned over and between isolation structures 134 and 138.

Figure 6:
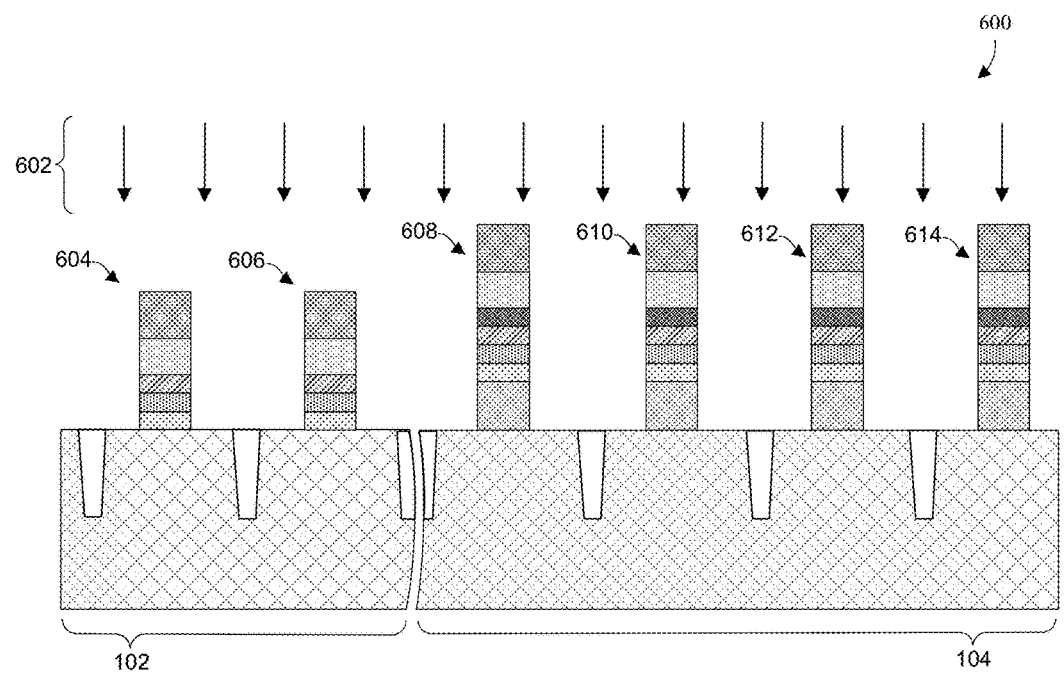

As illustrated by the cross-sectional view 600 of FIG. 6, the first set of layers 502-508 of the logic region 102 and the second set of layers 510-520 of the multi-voltage device region 104 are patterned with the first mask 522 in place. For example, the patterning 602 may be performed using photolithography to pattern the first set of layers 502-508 and the second set of layers 510-520 and subsequently stripping the first mask 522 resulting in gate stacks 604-614. In another embodiment, the patterning may be performed by etching the first set of layers 502-508 and the second set of layers 510-520.

Figure 7:
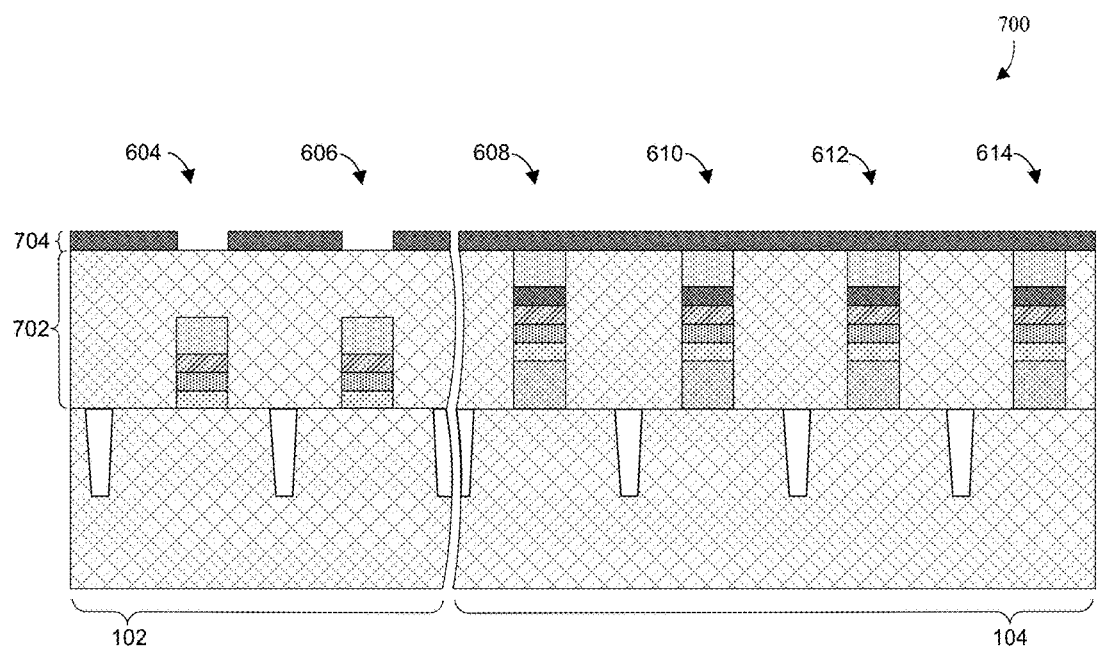

As illustrated by the cross-sectional view 700 of FIG. 7, a first sacrificial layer 702 is formed over the logic region 102 and the multi-voltage device region 104. In some embodiments, the uppermost surface of the first sacrificial layer 702 is collinear with the uppermost surface of the gate stacks 608-614 over both the logic region 102 and the multi-voltage device region 104. A second mask 704 is selectively deposited over the first sacrificial layer 702. The second mask 704 has openings over the gate stacks 604 and 606 in the logic region 102.

Figure 8:
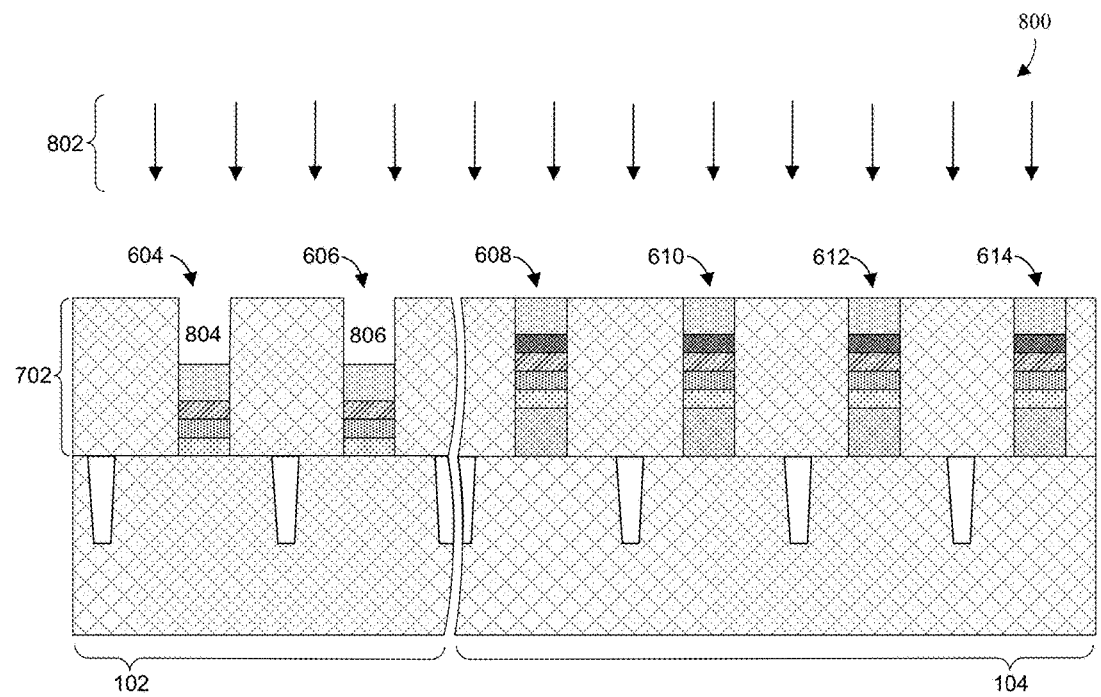

As illustrated by the cross-sectional view 800 of FIG. 8, the first set of layers 502-508 of the logic region 102 and the second set of layers 510-520 of the multi-voltage device region 104 are patterned with the second mask 704 (see FIG. 7) in place. The patterning 802 forms openings 804 and 806 over the gate stacks 604 and 606, respectively, and is subsequently removed from the logic region 102 and the multi-voltage device region 104.

Figure 9:
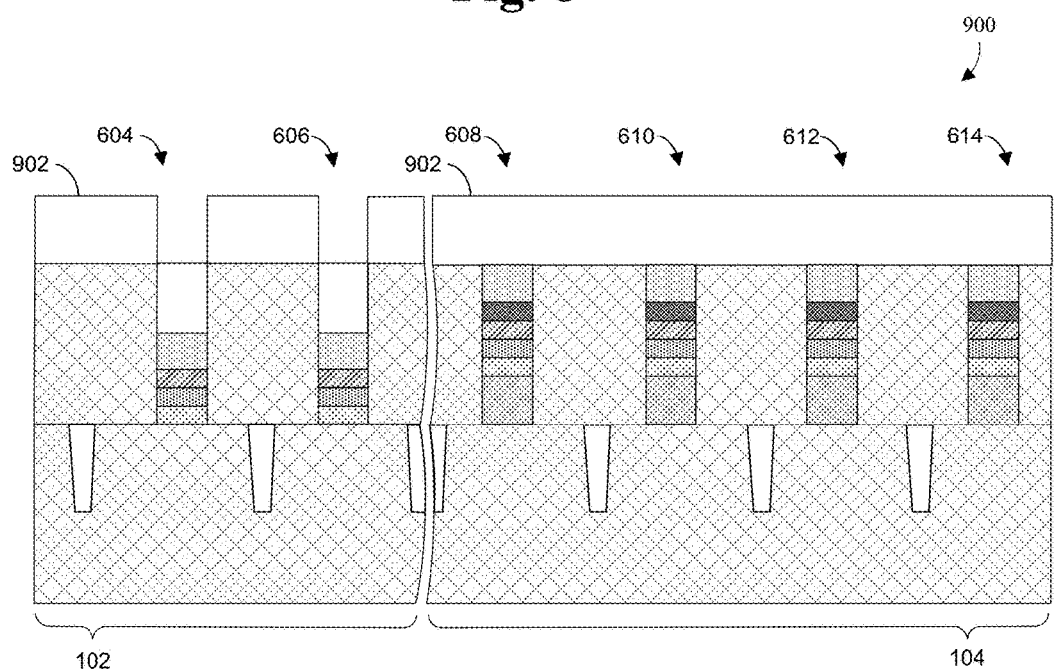

As illustrated by the cross-sectional view 900 of FIG. 9, an etch stop layer 902 is formed over the logic region 102 and the multi-voltage device region 104. The etch stop layer 902 fills the openings 804 and 806. The etch stop layer 902 may be, for example, silicon nitride, silicon oxynitride, silicon dioxide, or some other dielectric. The etch stop layer 902 may be about 300 to 400 Å thick, for example, the etch stop layer 902 may be 342 Å thick.

Figure 10:
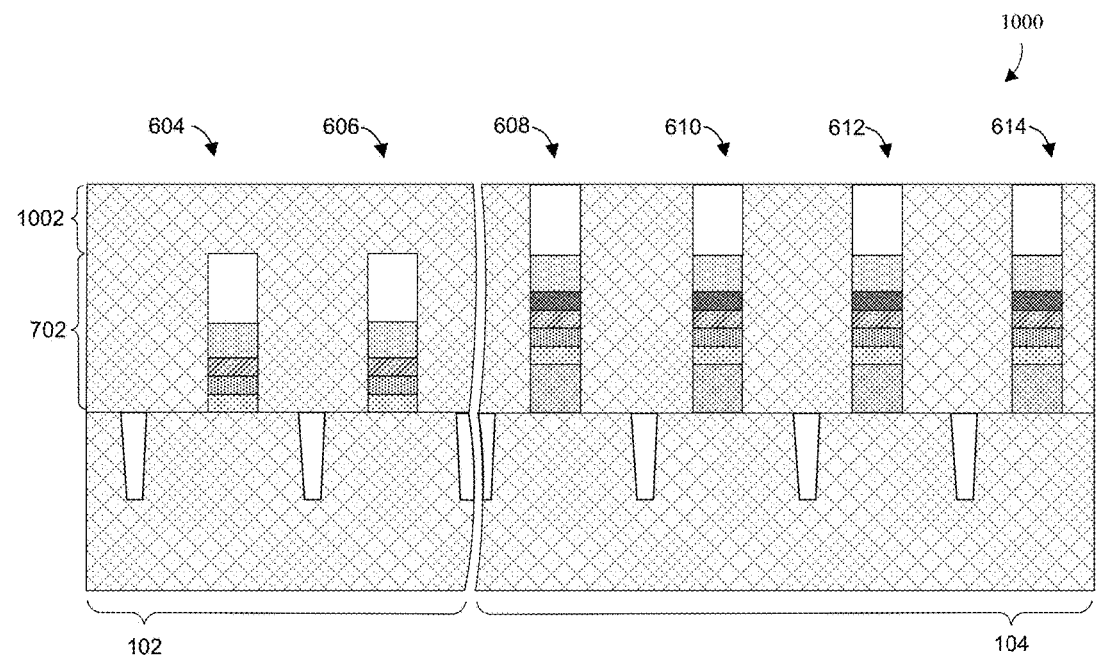

As illustrated by the cross-sectional view 1000 of FIG. 10, portions of the etch stop layer 902 over the gate stacks 608-614 are maintained and the remainder of the etch stop layer 902 are removed from the multi-voltage device region 104. A second sacrificial layer 1002 is formed over the logic region 102 and the multi-voltage device region 104 such that the second sacrificial layer 1002 is collinear over both the logic region 102 and the multi-voltage device region 104.

Figure 11:
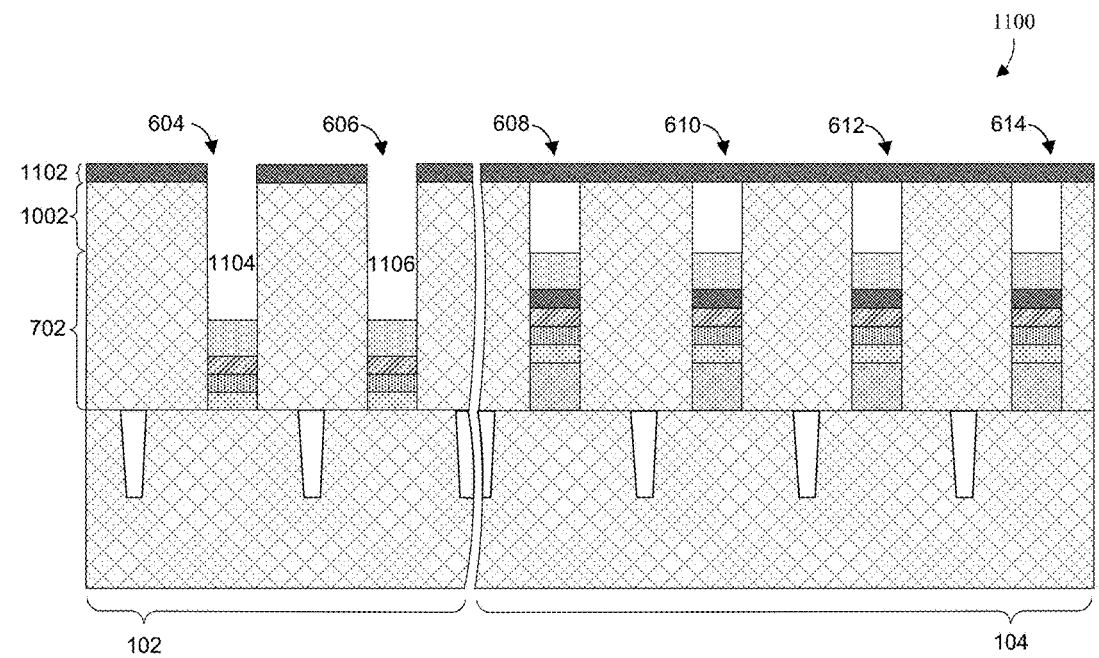

As illustrated by the cross-sectional view 1100 of FIG. 11, a third mask 1102 is deposited over the combined sacrificial layers 702, 1002 and the combined sacrificial layers 702, 1002 are patterned to form openings 1104 and 1106 over the gate stacks 604 and 606, respectively. In patterning, the etch stop layer 902 overlying the gate stacks 604 and 606 is also removed. Subsequently, the third mask 1102 is removed from the logic region 102 and the multi-voltage device region 104.

Figure 12:
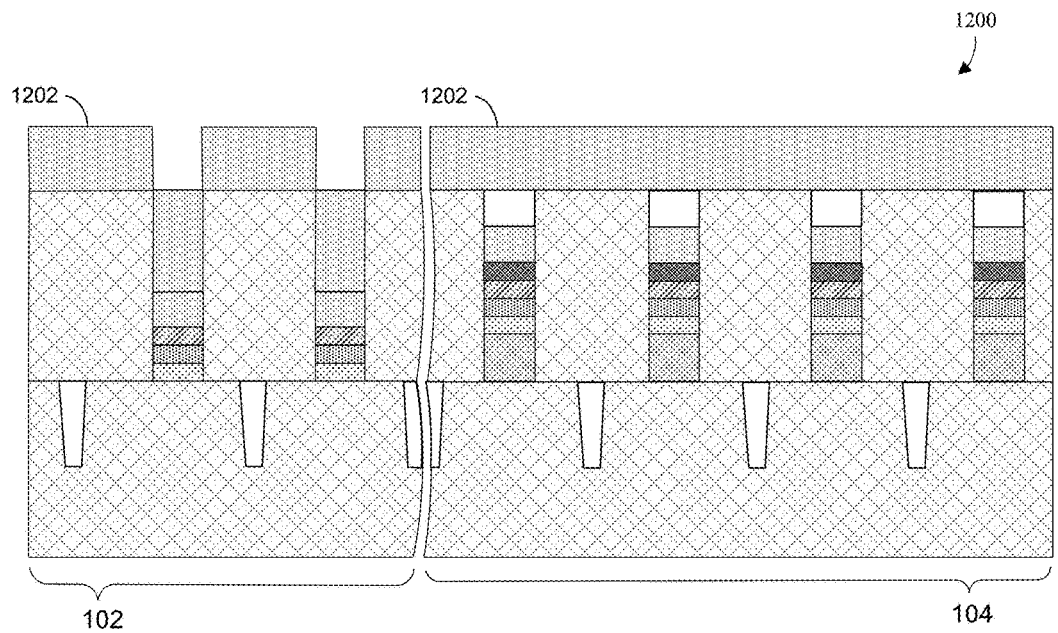

As illustrated by the cross-sectional view 1200 of FIG. 12, a second dummy gate layer 1202 is about 400 to 600 Å thick, for example, the second dummy gate layer 1202 may be 480 Å thick. The second dummy gate layer 1202 is comprised of a second dummy gate material. In some embodiments, the second dummy gate material may be, for example, polysilicon or some other material. Also, the second dummy gate material may be the same material as the first dummy gate material.

Figure 13:
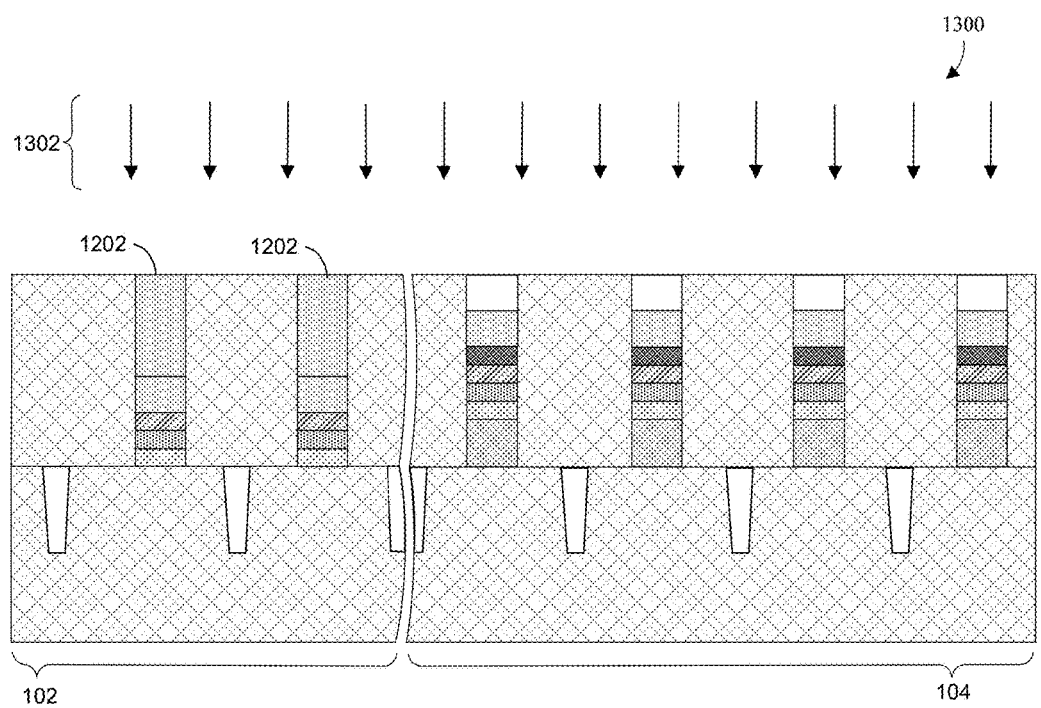

As illustrated by the cross-sectional view 1300 of FIG. 13, the uppermost surface of the logic region 102 and the multi-voltage device region 104 is planarized. The planarization 1302 may, for example, be performed by a chemical mechanical polish (CMP).

Figure 14:
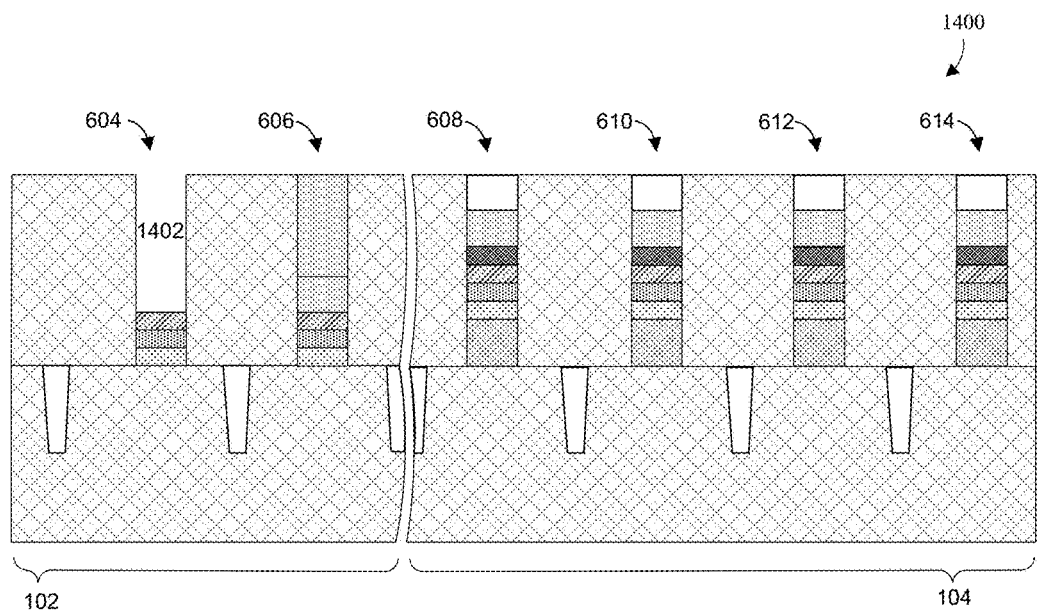

As illustrated by the cross-sectional view 1400 of FIG. 14, a portion of the dummy gate material over gate stack 604 is removed. In some embodiments, the second gate material (as shown in FIG. 12) is removed, forming an opening 1402.

Figure 15:
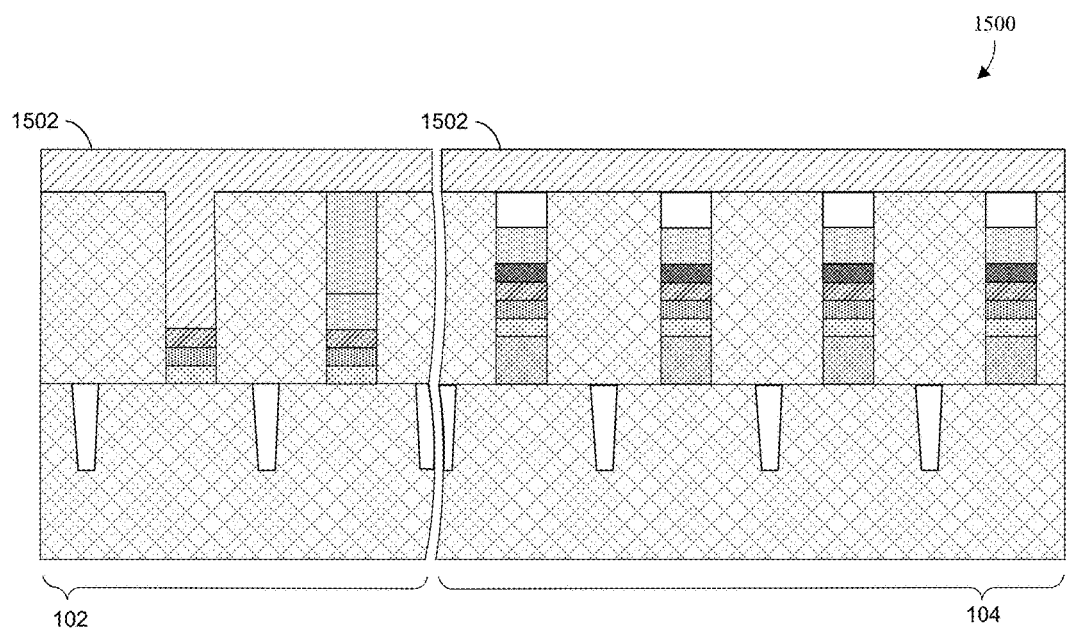

As illustrated by the cross-sectional view 1500 of FIG. 15, an n-type work function metal 1502 is deposited over the logic region 102 and the multi-voltage device region 104. The n-type work function metal 1502 fills the opening 1402 (as shown in FIG. 14). The n-type work function metal 1502 may be an n-type work function metal suitable for an nMOSFET having a work function between approximately 3.9 eV and 4.2 eV. In some embodiments, the n-type work function metal 1502 may be, for example ruthenium (Ru), zirconium (Zr), niobium (Nb), tantalum a), titanium silicide (TiSi$_2$) have a work function similar to a n-type doped semiconductor material.

Figure 16:
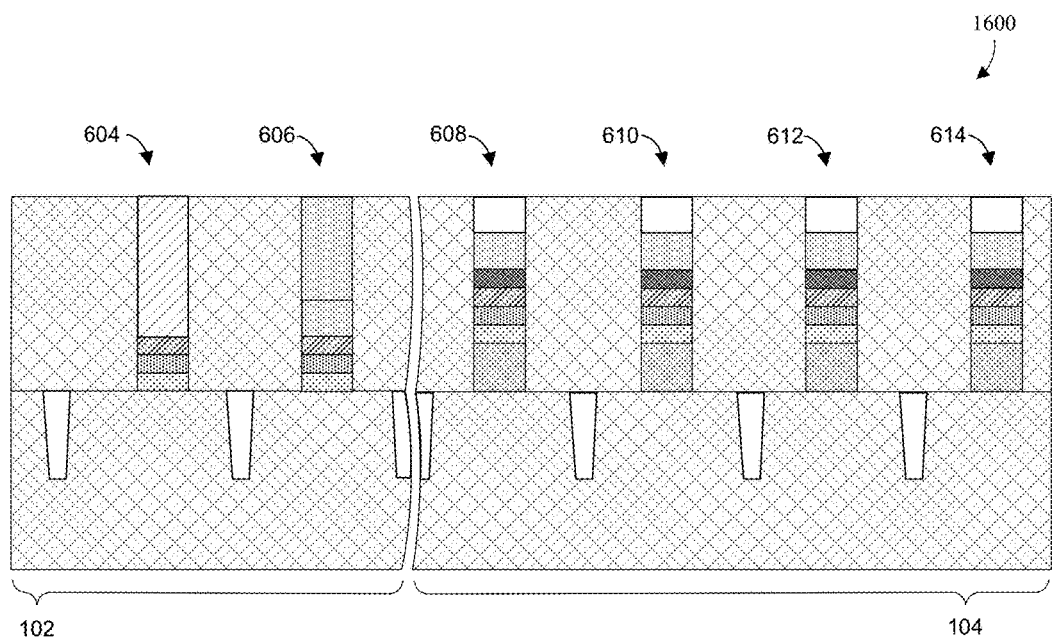

As illustrated by the cross-sectional view 1600 of FIG. 16, the uppermost surface of the logic region 102 and the multi-voltage device region 104 is planarized to remove the excess n-type work function metal 1502 in a first high-κ-metal-gate (HKMG) stack comprising a first high κ dielectric layer and a first gate metal material overlying the first high κ dielectric layer. The planarization may, for example, be performed by CMP.

Figure 17:
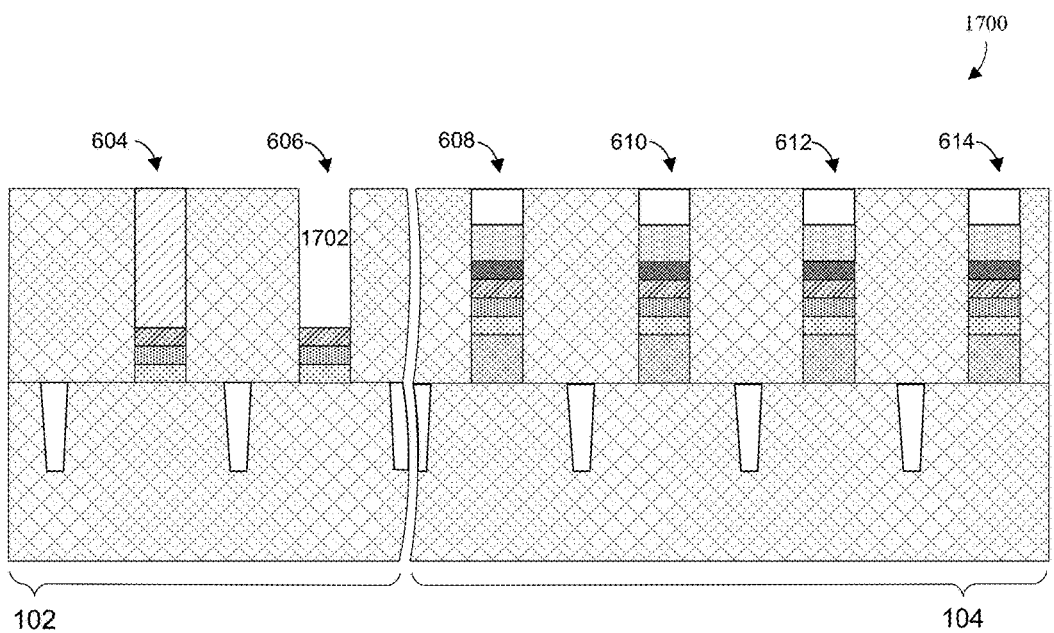

As illustrated by the cross-sectional view 1700 of FIG. 17, a portion of the dummy gate material over gate stack 606 is removed. In some embodiments, the second dummy gate layer 1202 (as shown in FIG. 12) is removed, forming an opening 1702.

Figure 18:
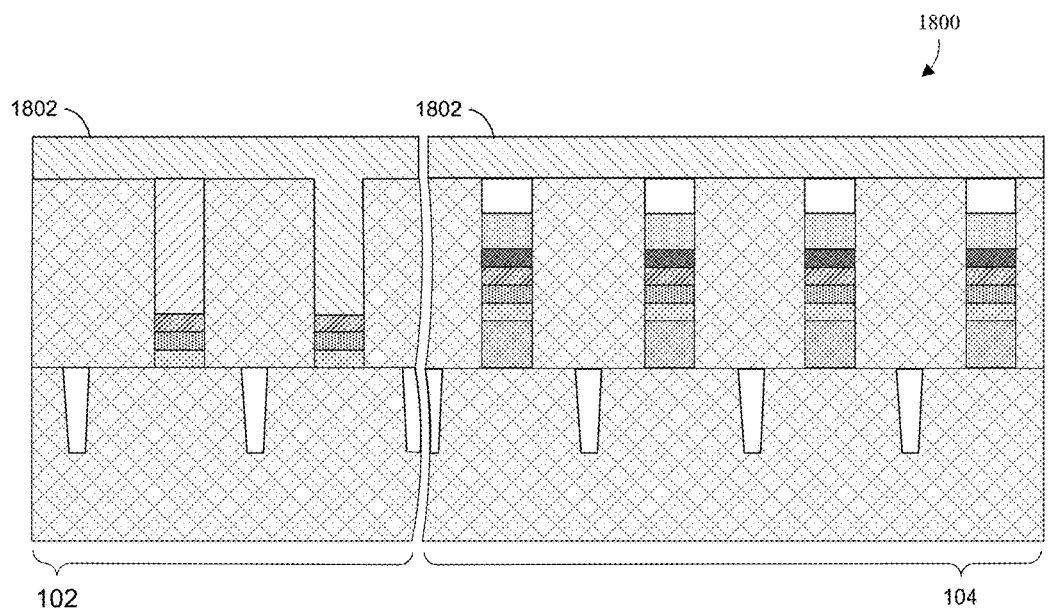
Figure 19:
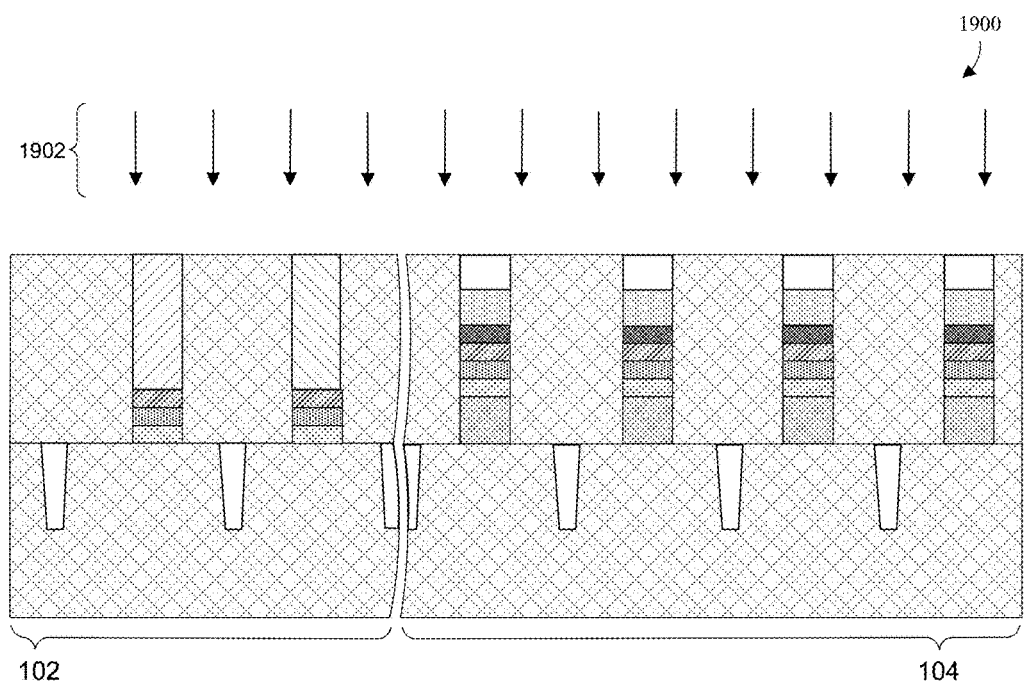

As illustrated by the cross-sectional view 1800 of FIG. 18, a p-type work function metal 1802 is deposited over the logic region 102 and the multi-voltage device region 104. The p-type work function metal 1802 fills the opening 1702 (as shown in FIG. 17). The p-type work function metal 1802 may be a p-type work function metal suitable for a pMOSFET having a work function between approximately 4.9 eV and 5.2 eV. In some embodiments, the nickel (Ni), ruthenium oxide (RuO), and molybdenum nitride (MoN) have a work function similar to a p-type doped semiconductor material As illustrated by the cross-sectional view 1900 of FIG. 19, the uppermost surface of the logic region 102 and the multi-voltage device region 104 is planarized to remove the excess p-type work function metal 1802 resulting in a second high-κ-metal-gate (HKMG) stack comprising a second high κ dielectric layer and a second gate metal material overlying the second high κ dielectric layer. The planarization 1902 may, for example, be performed by CMP.

Figure 20:
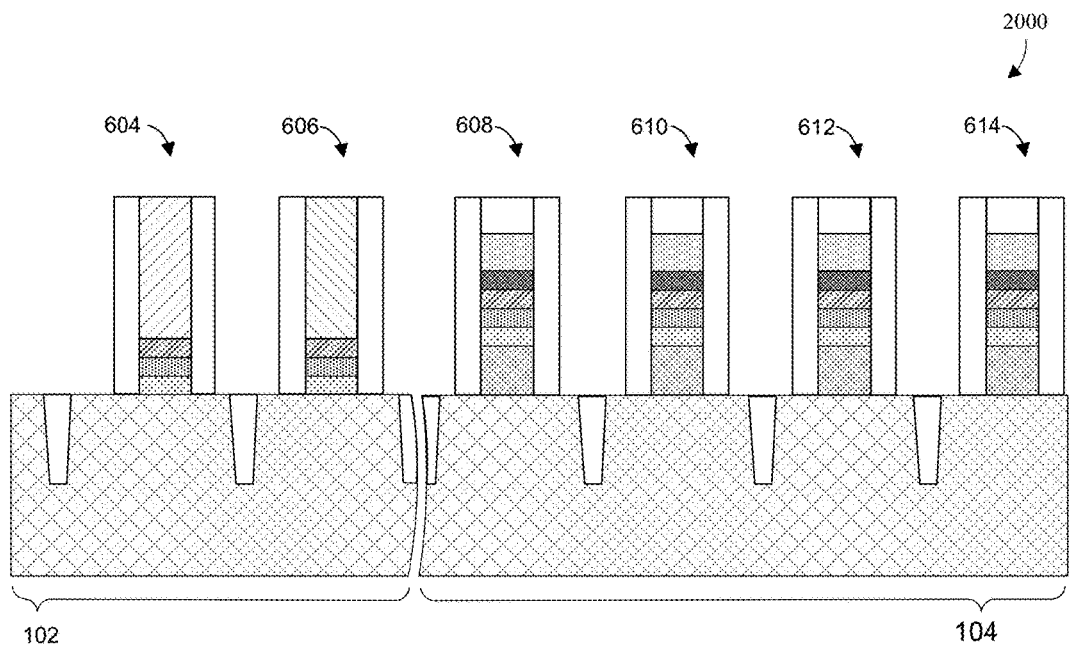

As illustrated by the cross-sectional view 2000 of FIG. 20, the combined sacrificial layers 702, 1002 are removed and sidewall spacers 128 are formed along sidewalls respectively of the gate stacks 604-614. The sidewall spacers 128 may, for example, be oxide or some other dielectric. In some embodiments, a process for forming the sidewall spacers 128 comprises forming gate spacer layer conformally covering and lining the gate stacks 604-616. The gate spacer layer may, for example, be formed by high temperature oxidation (HTO), which may, for example, be followed by rapid thermal annealing (RTA). Further, in some embodiments, the process comprises performing an etch back in to the inter-gate spacer layer to remove horizontal segments of the inter-gate spacer layer without removing vertical segments of the inter-gate spacer layer. The vertical segments correspond to the sidewall spacers 128.

Figure 21:
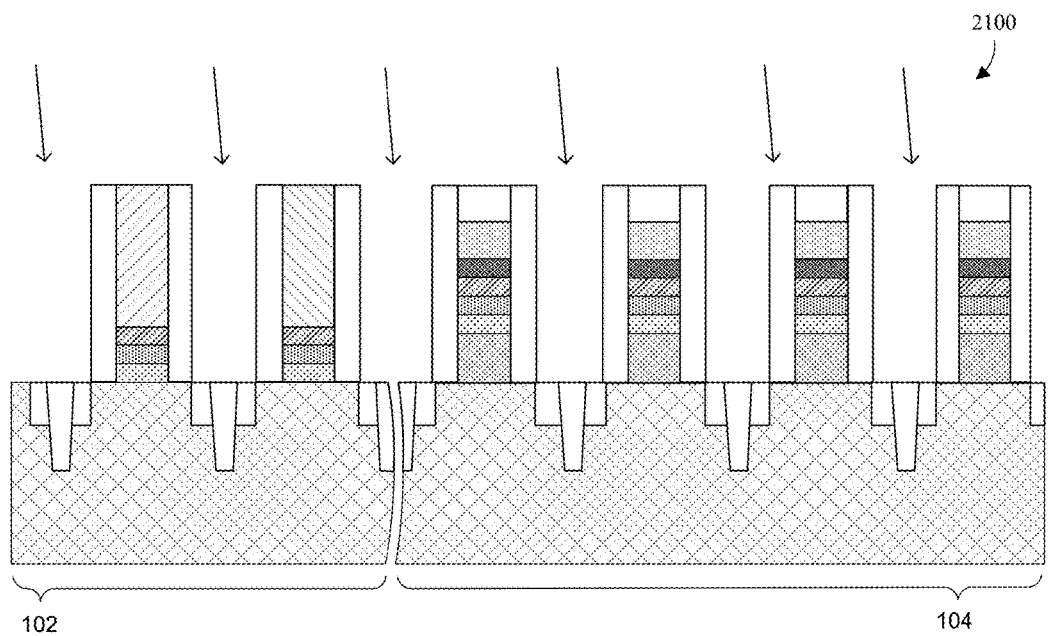

As illustrated by the cross-sectional view 2100 of FIG. 21, source/drain regions 114, 132, 136 are formed in the semiconductor substrate 106, between the gate stacks 604-614. In some embodiments, the source/drain region 136 is formed by ion implantation while a patterned photoresist layer covers the logic region 102 of the semiconductor substrate 106 multi-voltage device region 104 of the semiconductor substrate 106.

Figure 22:
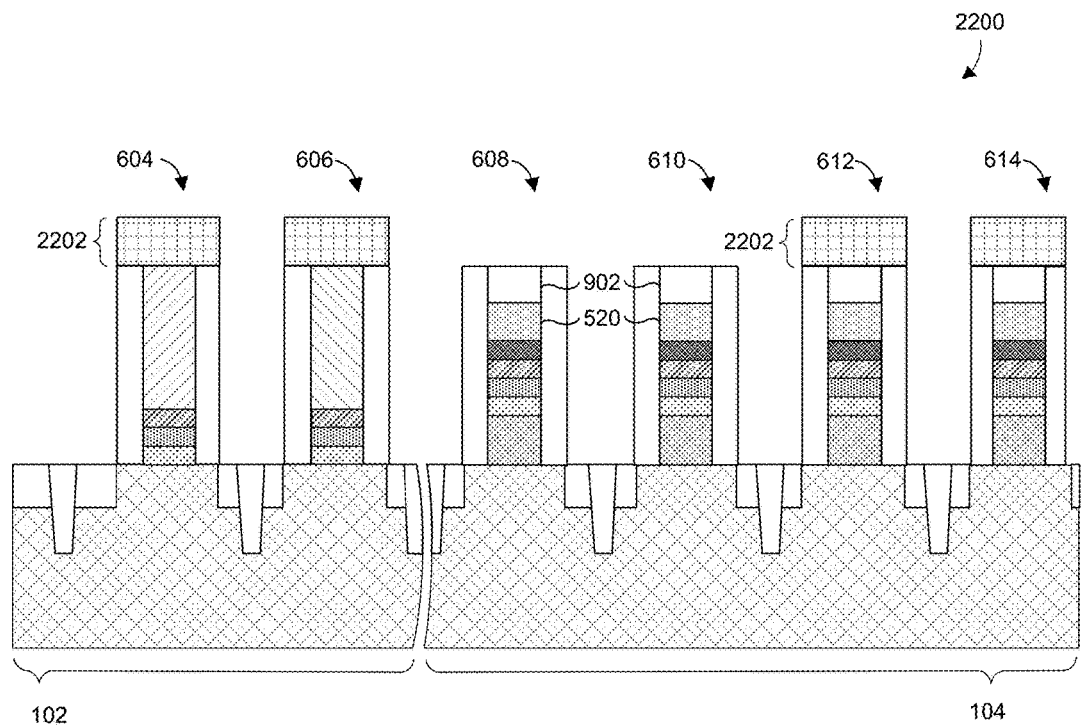

As illustrated the cross-sectional view 2200 of FIG. 22, an oxide hardmask 2202 is deposited over a subset of the gate stacks 604-614, for example, gate stacks 604, 606, 612, and 614. The etch stop layer 902 is removed from gate stack 608 and 610 exposing the first dummy gate layer 520.

Figure 23:
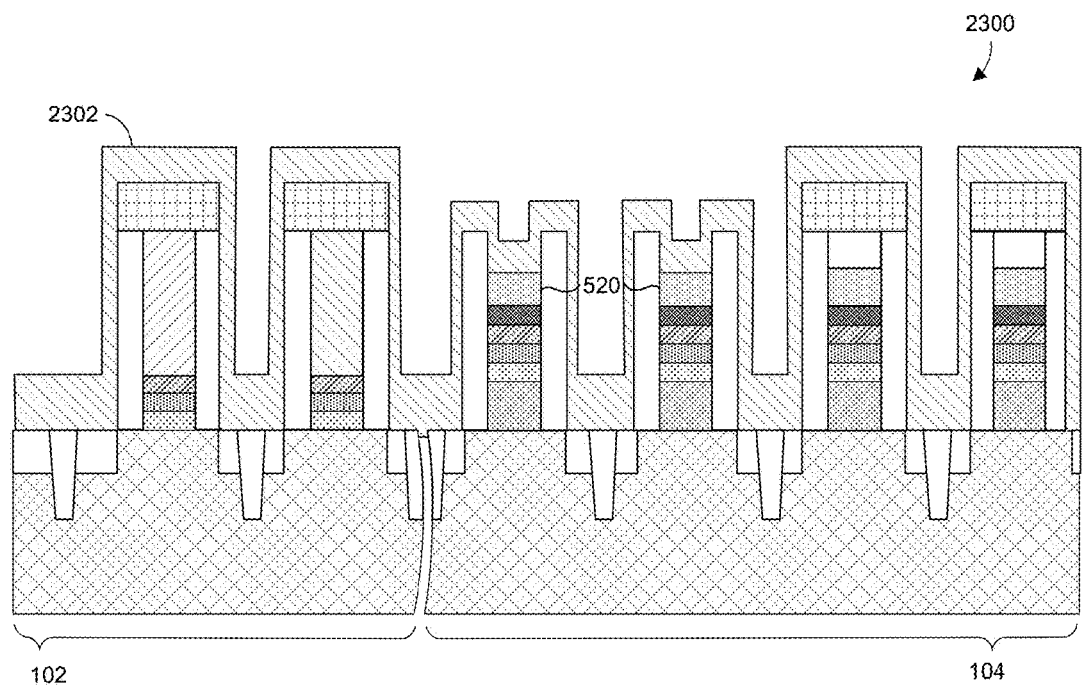

As illustrated the cross-sectional view 2300 of FIG. 23, a metallic layer 2302 is formed over the logic region 102 and the multi-voltage device region 104. In some embodiments, the metallic layer 2302 may be a nickel (Ni), cobalt (Co), titanium (Ti), or other metal suitable for being silicided. The thickness of the metallic layer 2302 is based on an amount of metallic material needed to silicide and consume the dummy gate layer 520.

Figure 24:
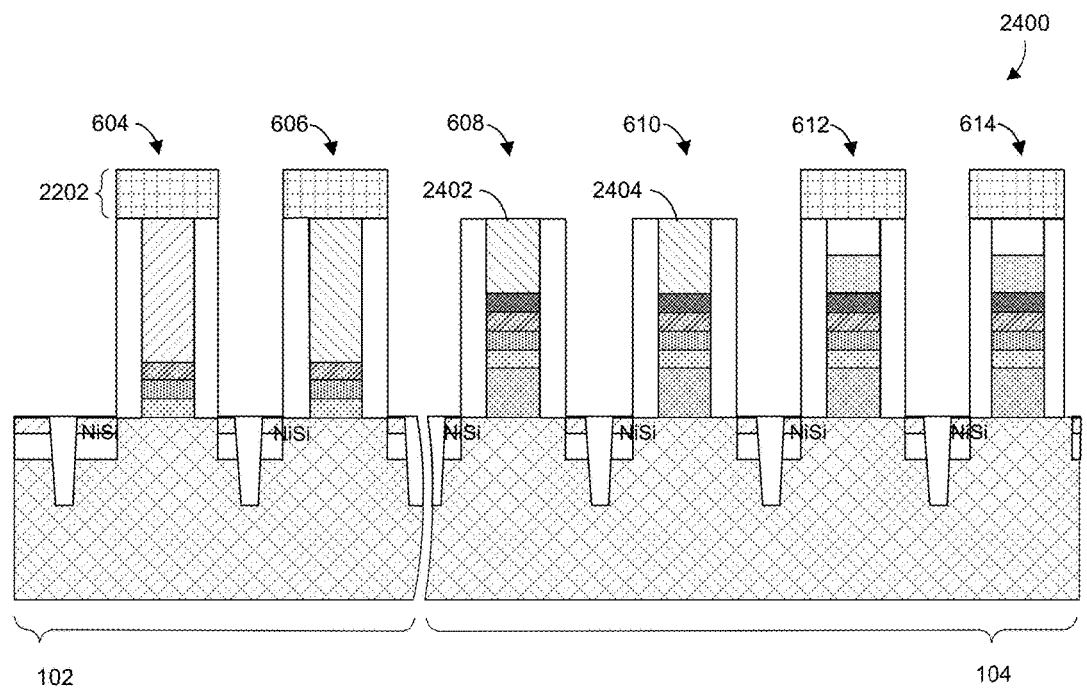

As illustrated the cross-sectional view 2400 of FIG. 24, the metallic layer 2302 is subjected to suitable processing to form a metal silicide layers 2402 and 2404 over the gate stacks 608 and 610, respectively. The processing forms the metal silicide layers 2402 and 2404 by reacting the metallic layer 2302 with the first dummy gate layer 520 that contains silicon. The processing can comprise, for example, rapid thermal annealing (RTA) to 450° C., being maintained for about 180 seconds.

Any excess portions of the metallic layer 2302 remaining after such processing can be removed by, for example, a wet etch. Conversely, a second RTA process can be performed to remove unreacted portions of the metallic layer 2302 (as shown in FIG. 23).

Figure 25:
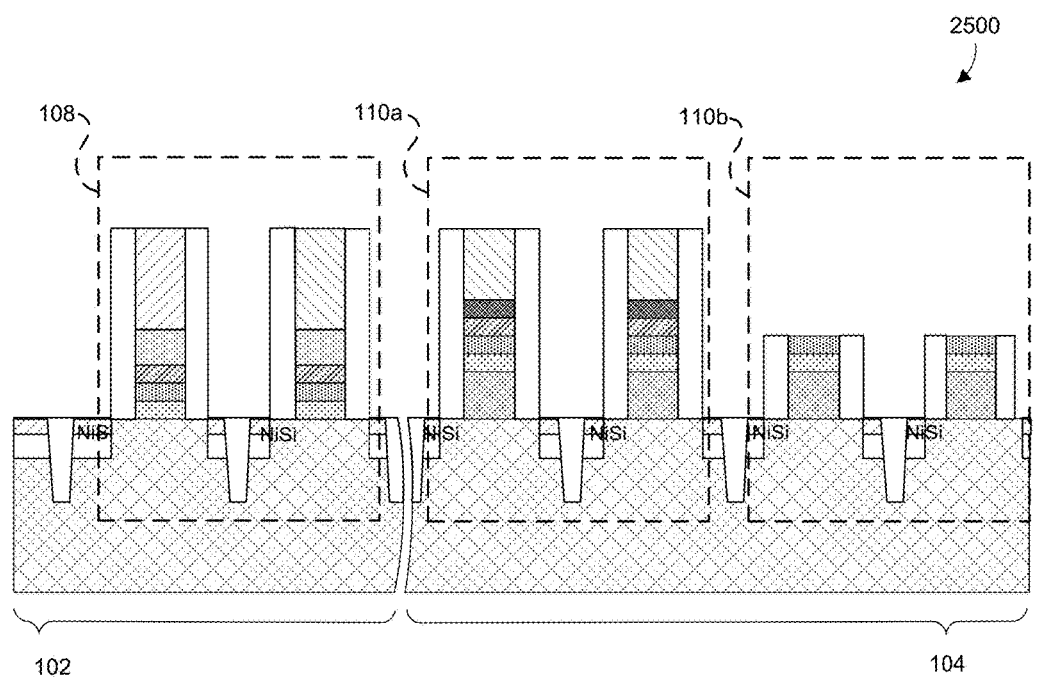

As illustrated the cross-sectional view 2500 of FIG. 25, undesired layers are removed from gate stacks to form the logic device 108 of the logic region 102 and the first device 110a and the second device 110b of the multi-voltage device region 104. For example, the oxide hardmask 2202 (as shown in FIG. 24) may be removed.

Figure 26:
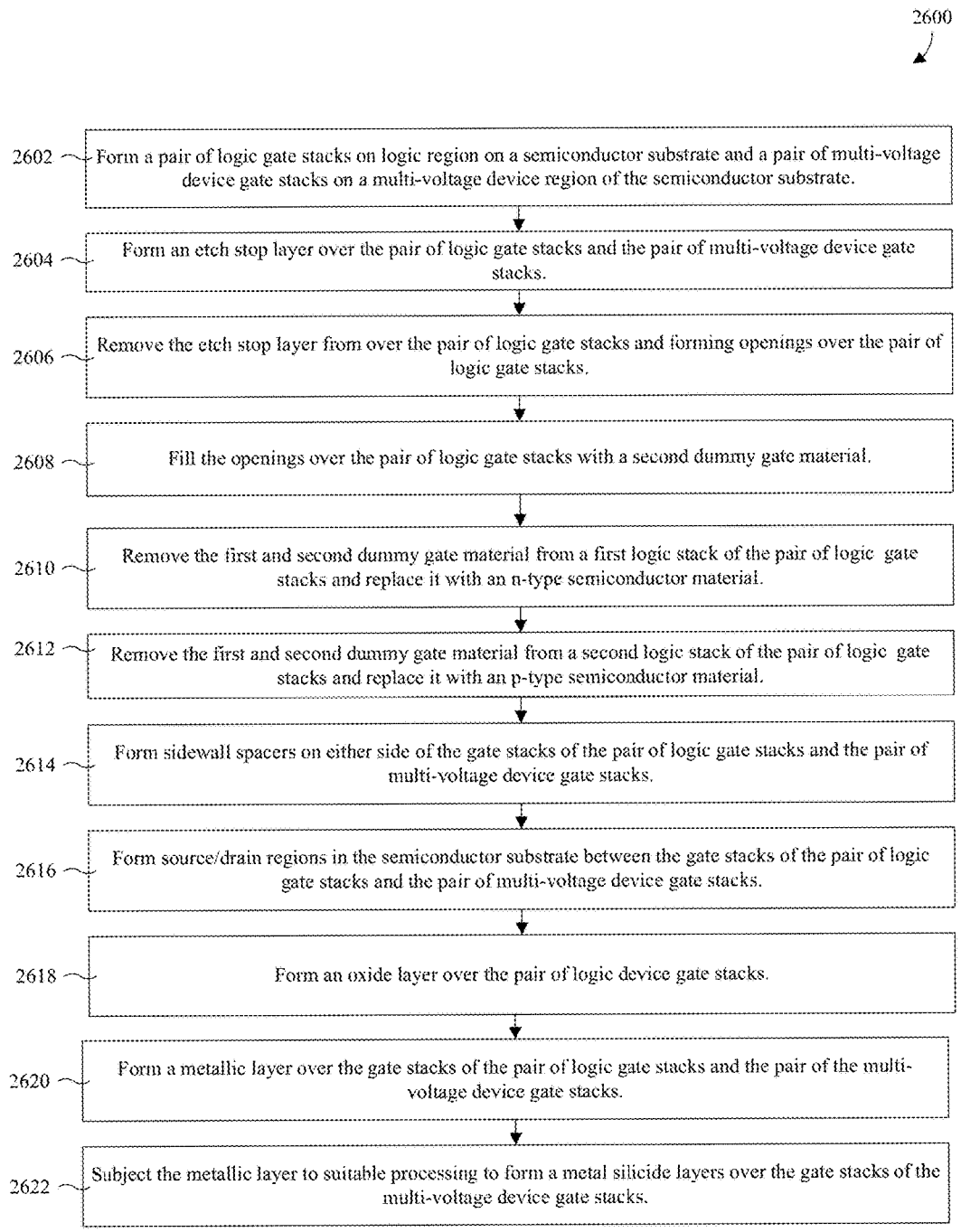
FIG. 26 illustrates a flowchart of some embodiments of the method of FIGS. 4-25.

With reference to FIG. 26, a flowchart 2600 of some embodiments of the method of FIGS. 4-25 is provided.

At 2602, a pair of logic gate stacks is formed on a logic region on a semiconductor substrate and a pair of device gate stacks a device region on a semiconductor substrate. The pair of logic gate stacks each comprise a dielectric stack and a first dummy gate material. The pair of device gate stacks have a gate oxide layer, a dielectric stack, a work function tuning layer, and the first dummy gate material. See, for example, FIGS. 4-6.

At 2604, an etch stop layer is formed over the pair of logic gate stacks and the pair of device gate stacks, which are surrounded by a sacrificial layer. See, for example, FIGS. 7-10.

At 2606, the etch stop layer is then removed from over the pair of logic gate stacks forming openings over the pair of logic gate stacks. See, for example, FIG. 11.

At 2608, the openings over the pair of logic gate stacks are filled with a second dummy gate material and are planarized. See, for example, FIG. 12.

At 2610, the first dummy layer and the second dummy gate material of a first logic stack of the pair of logic gate stacks is removed and replaced by an n-type gate material. See, for example, FIGS. 13-16.

At 2612, the first dummy layer and the second dummy gate material of a second logic stack of the pair of logic gate stacks is removed and replaced by a p-type gate material. See, for example, FIGS. 17-19.

At 2614, sidewall spacers are formed on either side of the gate stacks of the pair of logic gate stacks and the pair of device gate stacks. See, for example, FIG. 20.

At 2616, source/drain regions are formed in the semiconductor substrate between the gate stacks of the pair of logic gate stacks and the pair of device gate stacks. See, for example, FIG. 21.

At 2618, an oxide layer is deposited over the pair of logic device gate stacks and the etch stop layer over the pair of device gate stacks is removed. See, for example, FIG. 22.

At 2620, a metallic layer is formed over the gate stacks of the pair of logic gate stacks and the pair of the device gate stacks. See, for example, FIG. 23.

At 2622, the metallic layer is subjected to suitable processing to form a metal silicide layers over the gate stacks of the device gate stacks. See, for example, FIG. 24. Advantageously, the work function tuning layer allows the metal work function of the silicide layer to be adjusted resulting in tunable devices.

While the flowchart 2600 of FIG. 26 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a method for manufacturing multi-voltage devices using high-κ-metal-gate (HKMG) technology. The method includes forming a pair of logic gate stacks in a logic region of a semiconductor substrate and a pair of device gate stacks in a multi-voltage device region of the semiconductor substrate. The pair of logic gate stacks and the pair of device gate stacks include a first dummy gate material. The pair of device gate stacks also includes a work function tuning layer. The method further includes depositing a second dummy gate material over the pair of logic gate stacks. The first dummy gate material and the second dummy gate material from over a first logic gate stack of the pair of logic gate stacks are replaced with an n-type logic gate material. The first dummy gate material and the second dummy gate material from over a second logic gate stack of the pair of logic gate stacks are replaced with a p-type logic gate material. The method also includes deposit an oxide layer over the pair of logic gate stacks. A metallic layer is deposited over the logic region and the multi-voltage device region. Additionally, the method includes processing the metallic layer to form a metal silicide layer in a first device gate stack and a second device gate stack of the pair of device gate stacks.

Further, other embodiments of the present application provide an integrated circuit having a multi-voltage device. The IC includes a semiconductor substrate. The IC also includes a device on the semiconductor substrate. The device comprises a pair of source/drain regions in the semiconductor substrate. The device further comprises a first fully silicided gate and a second fully silicided gate. The first fully silicided gate and the second fully silicided gate are vertically separated from the semiconductor substrate by a work function tuning layer. The IC also includes a logic device on the semiconductor substrate, laterally spaced from the device. The logic device comprises a logic gate.

Further yet, other embodiments of the present application provide a method for manufacturing a device using high-κ-metal-gate (HKMG) technology. The method includes forming a pair of logic gate stacks on a logic region of a semiconductor substrate and a pair of device gate stacks on a multi-voltage device region of the semiconductor substrate. The pair of logic gate stacks and the pair of device gate stacks include a first dummy gate material. The pair of device gate stacks includes a work function tuning layer. An etch stop layer and a sacrificial layer are formed over the pair of logic gate stacks and the pair of device gate stacks. The etch stop layer is then removed from over the pair of logic gate stacks and forming openings over the pair of logic gate stacks. The method further includes depositing a second dummy gate material in the openings in the sacrificial layer over the pair of logic gate stacks. The first dummy gate material and the second dummy gate material from over a first logic gate stack of the pair of logic gate stacks are replaced with an n-type logic gate material resulting in a first high-κ-metal-gate (HKMG) stack comprising a first high κ dielectric layer and a first gate metal material overlying the first high κ dielectric layer. Likewise, the first dummy gate material and the second dummy gate material from over a second logic gate stack of the pair of logic gate stacks are replaced with a p-type logic gate material resulting in a second high-κ-metal-gate (HKMG) stack comprising a second high κ dielectric layer and a second gate metal material overlying the second high κ dielectric layer. Sidewall spacers are formed on either side of the gate stacks of the pair of logic gate stacks and the pair of device gate stacks. Source and drain regions are then formed in the semiconductor substrate between the gate stacks of the pair of logic gate stacks and the pair of device gate stacks. The method also includes depositing an oxide layer over the pair of logic gate stacks. A metallic layer is deposited over the logic region and the device region. Moreover, the method includes processing the metallic layer to form a metal silicide layer in a first device gate stack and a second device gate stack of the pair of device gate stacks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit (IC), the method comprising:
    forming a pair of logic gate stacks in a logic region of a semiconductor substrate and a pair of device gate stacks in a multi-voltage device region of the semiconductor substrate, wherein the pair of logic gate stacks and the pair of device gate stacks include a first dummy gate material, and wherein the pair of device gate stacks include a work function tuning layer;
    depositing a second dummy gate material over the pair of logic gate stacks;
    replacing the first dummy gate material and the second dummy gate material from over a first logic gate stack of the pair of logic gate stacks with an n-type gate material;
    replacing the first dummy gate material and the second dummy gate material from over a second logic gate stack of the pair of logic gate stacks with a p-type gate material;
    depositing an oxide layer over the pair of logic gate stacks;
    depositing a metallic layer over the logic region and the multi-voltage device region; and
    processing the metallic layer to form a metal silicide layer in a first device gate stack and a second device gate stack of the pair of device gate stacks.

2. The method according to claim 1, where the first dummy gate material and the second dummy gate material are comprised of polysilicon.

3. The method according to claim 1, wherein the metal silicide layer is less than 300 Å thick.

4. The method according to claim 1, wherein processing the metallic layer includes performing a first rapid thermal anneal.

5. The method according to claim 4, wherein processing the metallic layer further comprises performing a second rapid thermal anneal to consume remaining first dummy gate material from the first device gate stack or the second device gate stack.

6. The method according to claim 1, wherein the metallic layer is comprised of nickel and the metal silicide layer is comprised of nickel silicide.

7. The method according to claim 1, wherein the work function tuning layer is configured to adjust a work function of the metal silicide layer.

8. The method according to claim 1, wherein the work function tuning layer has a work function of approximately 4.5 eV.

9. The method according to claim 1, wherein the processing causes the pair of device gate stacks to be fully silicided gates that form a device.

10. A method for manufacturing an integrated circuit (IC), the method comprising:
    forming a pair of logic gate stacks on a logic region of a semiconductor substrate and a pair of device gate stacks on a multi-voltage device region of the semiconductor substrate, wherein the pair of logic gate stacks and the pair of device gate stacks include a first dummy gate material, and wherein the pair of device gate stacks include a work function tuning layer;
    forming a sacrificial layer over the pair of logic gate stacks and the pair of device gate stacks;
    removing the sacrificial layer from over the pair of logic gate stacks and forming openings in the sacrificial layer over the pair of logic gate stacks;
    depositing a second dummy gate material in the openings in the sacrificial layer over the pair of logic gate stacks;
    replacing the first dummy gate material and the second dummy gate material from over a first logic gate stack of the pair of logic gate stacks with an n-type gate material resulting in a first high-κ-metal-gate (HKMG) stack comprising a first high κ dielectric layer and a first gate metal material overlying the first high κ dielectric layer;
    replacing the first dummy gate material and the second dummy gate material from over a second logic gate stack of the pair of logic gate stacks with a p-type gate material resulting in a second high-κ-metal-gate (HKMG) stack comprising a second high κ dielectric layer and a second gate metal material overlying the second high κ dielectric layer;
    forming sidewall spacers on either side of the gate stacks of the pair of logic gate stacks and the pair of device gate stacks;
    forming source and drain regions in the semiconductor substrate between the gate stacks of the pair of logic gate stacks and the pair of device gate stacks;
    depositing an oxide layer over the pair of logic gate stacks;
    depositing a metallic layer over the logic region and the multi-voltage device region; and
    processing the metallic layer to form a metal silicide layer in a first device gate stack and a second multi-voltage device gate stack of the pair of device gate stacks.

11. The method according to claim 10, wherein processing the metallic layer includes:
    performing a first rapid thermal anneal to cause the metallic layer to react with the first dummy gate material to create the metal silicide layer; and
    performing a second rapid thermal anneal to consume any remaining first dummy gate material from the first device gate stack and the second device gate stack.

12. The method according to claim 10, wherein the metallic layer is comprised of nickel and the metal silicide layer is comprised of nickel silicide.

13. The method according to claim 10, wherein the work function tuning layer is configured to adjust a work function of the metal silicide layer.

14. A method for manufacturing an integrated circuit (IC), the method comprising:
   forming a first gate stack over a first region of a semiconductor substrate, the first gate stack comprising a work function tuning layer and a polysilicon gate structure over the work function tuning layer;
   forming a second gate stack over a second region of the semiconductor substrate, the second gate stack comprising a first dummy gate structure and a second dummy gate structure over the first dummy gate structure;
   removing the first dummy gate structure and the second dummy gate structure from the second gate stack, thereby forming an opening over the second region of the semiconductor substrate, while the work function tuning layer and the polysilicon gate structure remain in place over the first region of the semiconductor substrate;
   filling the opening with an n-type gate material or a p-type gate material;
   forming a mask layer that covers the n-type gate material or p-type gate material in the opening but that does not cover the polysilicon gate structure;
   forming a metallic layer that extends over the polysilicon gate structure and over the mask layer; and
   performing at least one heat treatment with the metallic layer in place to convert the polysilicon gate structure to a silicide gate structure.

15. The method according to claim 14, wherein the silicide gate structure includes a metal silicide layer that is less than 300 Å thick.

16. The method according to claim 15, wherein the metal silicide layer is comprised of nickel silicide.

17. The method according to claim 14, wherein a lowermost surface of the work function tuning layer contacts an uppermost surface of a barrier layer, and wherein the uppermost surface of the barrier layer contacts a lowermost surface of the polysilicon gate structure.

18. The method according to claim 14, wherein a high κ dielectric layer separates the polysilicon gate structure from an upper surface of the semiconductor substrate.

19. The method according to claim 18, wherein a gate oxide separates a lower surface of the high κ dielectric layer from the upper surface of the semiconductor substrate.

20. The method according to claim 14, wherein the work function tuning layer has a work function of approximately 4.5 eV.

* * * * *